(12) United States Patent  
Wu

(10) Patent No.: US 7,006,022 B1
(45) Date of Patent: Feb. 28, 2006

(54) SYSTEM AND METHOD FOR ENHANCING DATA CORRECTION CAPABILITY USING ERROR INFORMATION OBTAINED FROM DEMODULATION PROCEDURES

(75) Inventor: Sheng-Hung Wu, Hsinchu (TW)

(73) Assignee: Cheertek, Inc., Hsinchu (TW)

( * ) Notice: Subject to any disclaimer, the term of this patent is extended or adjusted under 35 U.S.C. 154(b) by 0 days.

(21) Appl. No.: 10/961,214

(22) Filed: Oct. 12, 2004

(51) Int. Cl.
*H03M 1/06* (2006.01)
*H03M 3/00* (2006.01)

(52) U.S. Cl. ....................... 341/118; 341/143
(58) Field of Classification Search .............. 341/143, 341/141, 156, 155, 118; 708/313
See application file for complete search history.

(56) References Cited

U.S. PATENT DOCUMENTS

| | | | | |
|---|---|---|---|---|
| 4,939,517 A | * | 7/1990 | Baltus et al. ............... | 341/156 |
| 5,248,971 A | * | 9/1993 | Mandl ......................... | 341/141 |
| 5,621,408 A | * | 4/1997 | Cake et al. ................... | 341/143 |
| 6,151,613 A | * | 11/2000 | Khoini-Poorfard .......... | 708/313 |
| 6,292,121 B1 | * | 9/2001 | Cake et al. ................... | 341/143 |
| 6,373,418 B1 | * | 4/2002 | Abbey .......................... | 341/143 |
| 6,538,592 B1 | * | 3/2003 | Yang et al. ................... | 341/155 |

* cited by examiner

*Primary Examiner*—Jean Bruner Jeanglaude
(74) *Attorney, Agent, or Firm*—Akin Gump Strauss Hauer & Feld, LLP

(57) ABSTRACT

A signal processing system that comprises a sampling device for converting a continuous signal into a discrete signal, a quantizing device for converting the discrete signal into a first bit stream, each bit in the bit stream having a first value, a detector for determining whether at least one bit in the first bit stream includes a second value different from the first value of the at least one bit, and a demultiplexer for converting a section of the first bit stream into a first modulation code, and converting a section of a second bit stream into a second modulation code, the second bit stream being formed by replacing the first value of the at least one bit in the first bit stream with the second value.

45 Claims, 3 Drawing Sheets

SYSTEM AND METHOD FOR ENHANCING DATA CORRECTION CAPABILITY USING ERROR INFORMATION OBTAINED FROM DEMODULATION PROCEDURES

BACKGROUND

1. Field of the Invention

The present invention relates generally to data processing, and more particularly, to a system and method for enhancing error correction capability by using error information obtained in demodulation procedures.

2. Background of the Invention

In a signal processing system, data to be transmitted is modulated and coded, and data to be received is demodulated and decoded. A digital data recording/reproducing system modulates, multiplexes and codes data so as to record the data in a recording medium, and demultiplexes, demodulates and decodes the coded data so as to reproduce the recorded data. A recording/reproducing medium such as a digital video disc ("DVD") or a compact disc ("CD") is subject to various types of distortion, noise and interference. Various errors may occur at the output of the recording/reproducing medium. To reproduce data recorded on a disc, a laser beam is used to scan a recording surface of the disc, detect the light reflected from the recording surface of the disc, and produce a reproduction signal, for example, a radio frequency ("RF") signal. The reproduction signal is input to a demodulation circuit where demodulation is performed. The demodulated data are sent to an error correction code ("ECC") circuit or cyclic redundancy check ("CRC") circuit, which is generally used to overcome errors arising from the storage medium.

As an example of an ECC circuit, an ECC decoder of the ECC circuit may process the demodulated data according to a C1/C2 convolution Reed Solomon decoding algorithm (CIRCplus). There are two kinds of error data, an erasure error and a general error. An erasure error refers to error data of which error location can be determined by an associated error flag. A general error refers to error data provided without any error flag, thereby making it possible to determine its error location. Generally, the ECC decoder corrects the general error in the C2 code, and corrects the general error and the erasure error in the C1 code.

In a conventional demodulation procedure, a reproduction signal may be sampled and quantized into a digital bit stream. A demultiplexer determines timing slots of the digital bit stream and converts the digital bit stream into modulation codes. A demodulator converts the modulation codes into symbols and sends the symbols to an ECC circuit for error correction. The ECC circuit may perform a syndrome check to determine whether the symbols contain an error, and corrects the error, if any. The ECC circuit, however, may not be able to correct the error. In the conventional demodulation procedure, some information related to the modulation codes is neglected, for example, temporal error information or spatial error information. The error information may be useful to improve error correction capability of an ECC circuit. It is thus desirable to collect error information during generation of a modulation code in a demodulation procedure.

BRIEF SUMMARY OF THE INVENTION

The present invention is directed to a system and a method that obviates one or more problems resulting from the limitations and disadvantages of the prior art.

In accordance with an embodiment of the present invention, there is provided a signal processing system that comprises a sampling device for converting a continuous signal into a discrete signal, a quantizing device for converting the discrete signal into a first bit stream, each bit in the bit stream having a first value, a detector for determining whether at least one bit in the first bit stream includes a second value different from the first value of the at least one bit, and a demultiplexer for converting a section of the first bit stream into a first modulation code, and converting a section of a second bit stream into a second modulation code, the second bit stream being formed by replacing the first value of the at least one bit in the first bit stream with the second value.

Also in accordance with the present invention, there is provided a signal processing system that comprises a sampling device for converting a continuous signal into a discrete signal transmitting in a waveform, a digitizer circuit for converting the discrete signal into a first bit stream, each bit in the first bit stream having a first value, and detecting whether a transition occurs at an interception of the waveform of the discrete signal and a slicing level, a detector for determining whether an offset between the transition and a corresponding clock edge provided by the sampling device is significant, and determining that a bit in the first bit stream associated with the transition includes a second value different from the first value of the bit if the offset is significant, and a demultiplexer for converting a section of the first bit stream into a first modulation code, and converting a section of a second bit stream into a second modulation code, the second bit stream being formed by replacing the first value of the bit in the first bit stream with the second value.

Further in accordance with the present invention, there is provided a signal processing system that comprises a sampling device for converting a continuous signal into a discrete signal, a partial response maximum likelihood ("PRML") circuit for selecting a path of the most likelihood among a plurality of maximum likelihood paths each having an evaluation index, and converting the selected path into a first bit stream, each bit of the first bit stream having a first value, a detector for determining whether an offset between the evaluation index of the selected path and the evaluation index of one of the unselected paths is significant, and determining that at least one bit in the first bit stream includes a second value different from the first value of the at least one bit if the offset is significant, and a demultiplexer for converting a section of the first bit stream into a first modulation code, and converting a section of a second bit stream into a second modulation code, the second bit stream being formed by replacing the first value of the at least one bit in the first bit stream with the second value.

Still in accordance with the present invention, there is provided a method of signal processing that comprises converting a continuous signal into a discrete signal, converting the discrete signal into a first bit stream, each bit in the first bit stream having a first value, determining whether at least one bit in the first bit stream includes a second value different from the first value of the at least one bit, forming a second bit stream by replacing the first value of the at least one bit in the first bit stream with the second value, converting a section of the first bit stream into a first modulation code, and converting a section of the second bit stream into a second modulation code.

Yet still in accordance with the present invention, there is provided a method of signal processing that comprises converting a continuous signal into a discrete signal transmitting in a waveform, converting the discrete signal into a first bit stream, each bit in the first bit stream having a first value, detecting whether a transition occurs at an interception of the waveform of the discrete signal and a slicing level, determining whether an offset between the transition and a corresponding clock edge provided by the sampling device is significant, determining that a bit in the first bit stream associated with the transition includes a second value different from the first value of the bit if the offset is significant, forming a second bit stream by replacing the first value of the bit in the first bit stream with the second value, converting a section of the first bit stream into a first modulation code, and converting a section of the second bit stream into a second modulation code.

Further still with the present invention, there is provided a method of signal processing that comprises converting a continuous signal into a discrete signal, selecting a path of the most likelihood among a plurality of maximum likelihood paths each having an evaluation index, converting the selected path into a first bit stream, each bit of the first bit stream having a first value, determining whether an offset between the evaluation index of the selected path and the evaluation index of one of the unselected paths is significant, determining that at least one bit in the first bit stream includes a second value different from the first value of the at least one bit if the offset is significant, forming a second bit stream by replacing the first value of the at least one bit in the first bit stream with the second value, converting a section of the first bit stream into a first modulation code, and converting a section of the second bit stream into a second modulation code.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serves to explain the principles of the invention.

BRIEF DESCRIPTION OF THE DRAWINGS

Reference will now be made in detail to the present embodiment of the invention, an example of which is illustrated in the accompanying drawings. Wherever possible, the same reference numbers are used throughout the drawings to refer to the same or like parts.

DETAILED DESCRIPTION OF THE INVENTION

Figure 1:
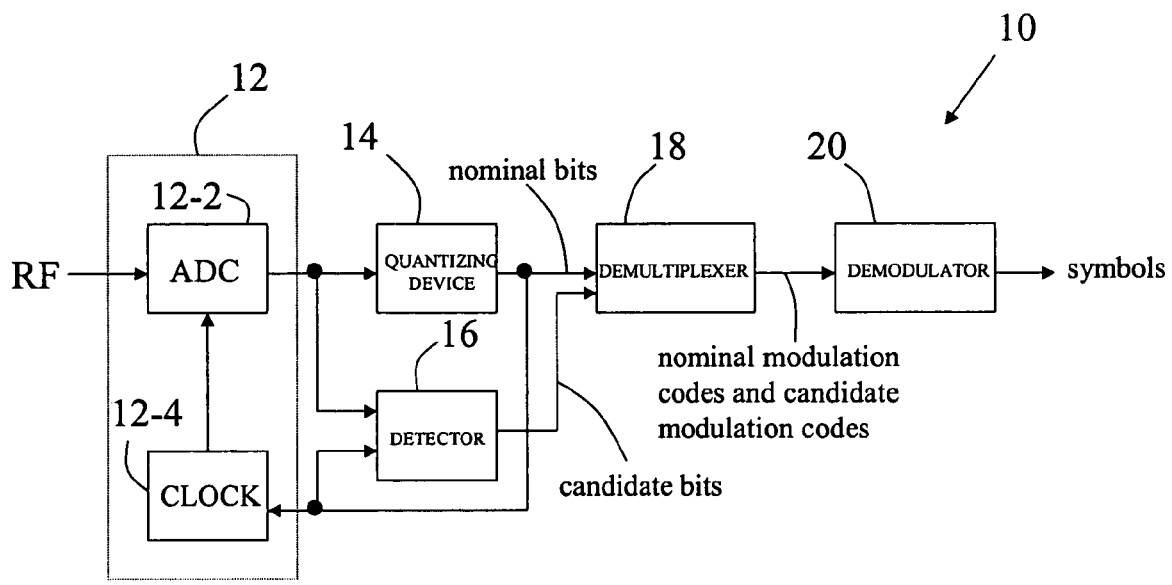
FIG. 1 is a schematic block diagram of a signal processing system in accordance with one embodiment of the present invention.

FIG. 1 is a schematic block diagram of a signal processing system 10 in accordance with an embodiment of the present invention. Referring to FIG. 1, system 10 includes a sampling device 12, a quantizing device 14, a detector 16, a demultiplexer 18, and a demodulator 20. Sampling device 12 receives a reproduction signal such as a radio frequency ("RF") signal and converts the continuous reproduction signal into a discrete one. The reproduction signal, in either digital or analog form, may be transmitted in a waveform over a channel or carrier from a digital video disc ("DVD"), a compact disc ("CD"), an antenna or a cable. Sampling device 12 includes a slicing circuit or an analog-to-digital converter ("ADC") 12-2 and a clock generator 12-4. In one embodiment according to the invention, clock generator 12-4 provides a fixed clock for use throughout system 10. In another embodiment, clock generator 12-4 includes a phase-locked loop ("PLL") circuit or a digital PLL ("DPLL") circuit, which provides a clock dependent of the timing information contained in the reproduction signal. Moreover, the PLL circuit or DPLL circuit may also provide a fixed clock.

Quantizing device 14 converts the discrete reproduction signal into a bit stream, which includes a synchronization pattern. In one embodiment according to the invention, quantizing device 14 includes a digitizer, which compares the waveform of the discrete reproduction signal with a slicing level in providing the bit stream. All of the bits in the bit stream quantized by quantizing device 14 are nominal bits. Quantizing device 14 detects whether a transition occurs at an interception of the waveform and the slicing level. A transition may include, for example, a zero-cross point if a PLL or DPLL circuit is used or a zero-cross interpolation point if a fixed clock circuit is used. Ideally, a transition occurs at a rising edge of a clock. In practice, however, a transition may offset from a corresponding clock edge due to distortion, noise or interference. As a result, a bit corresponding to the transition may have a different value. That is, the value of a nominal bit at around a transition determined by quantizing device 14, for example, logical one, should be logical zero, or vice versa.

Detector 16 compares the bit stream with the discrete reproduction signal to detect whether an offset between a transition associated with a nominal bit and a corresponding clock edge is significant. If the offset exceeds a threshold predetermined by a user of signal processing system 10, which means that the determined value may be wrong, the offset is determined significant. Detector 16 determines that the nominal bit corresponding to the offset includes a candidate value or candidate bit. The candidate bit is stored in, for example, a memory device (not shown). If the offset falls below the threshold, the offset is determined not significant. Detector 16 determines that the nominal bit corresponding to the offset does not include a candidate bit.

In another embodiment according to the invention, quantizing device 14 includes a partial response maximum likelihood ("PRML") circuit for a PRML search. The PRML search meets the requirements of higher recording density and lower error rate in the development of advanced recording/reproducing medium. In quantizing device 14 using the PRML search, a waveform interference amount between adjacent bits of a reproduction signal waveform is permitted in a range specified by a partial response ("PR") class, and a maximum likelihood ("ML") circuit is used to select a path of the most likelihood among a plurality of maximum likelihood paths each having an evaluation index. In selecting a path of the most likelihood, i.e., a primary path, quantizing device 14 takes portions before and after the reproduction signal waveform into consideration. The primary path has the greatest evaluation index, which is distinguishable from the evaluation index of each of unselected paths. That is, the evaluation index of each of the unselected paths has an offset from that of the primary path.

Detector 16 determines that bits corresponding to the primary path are nominal bits. Detector 16 also detects whether an offset is significant. If the offset falls below a threshold predetermined by a user of signal processing system 10, which means that one of unselected paths may be a true primary path, the offset is determined significant. Detector 16 determines that bits corresponding to the offset include candidate bits. If the offset exceeds the threshold, the offset is determined not significant. Detector 16 determines that bits corresponding to the offset do not include candidate bits. The candidate bits are stored in, for example, a memory device (not sown).

Quantizing device 14 provides a bit stream including only nominal bits, i.e., a nominal bit stream, to demultiplexer 18. Candidate bit stream(s) are also provided to demultiplexer 18. A candidate bit stream is formed by replacing in the nominal bit stream at least one nominal bit with its corresponding candidate bit, other bits being equal. The number of candidate bit streams, N, is calculated as follows. For example, if a nominal bit stream includes M candidate bits, then N equals $2^M-1$, M, N being a positive integer or zero.

Demultiplexer 18 detects the synchronization pattern of the nominal bit stream and candidate bit streams to determine time slots for these bit streams. Demultiplexer 18 then converts the bit streams into modulation codes out of the time slots. Specifically, a section of the nominal bit stream in a time slot is converted into a nominal modulation code, and a section of one of the candidate bit stream in a time slot is converted into a candidate modulation code. Demultiplexer 18 provides a nominal modulation code and N candidate modulation codes to demodulator 20.

Demodulator 20 converts the nominal modulation code and the N candidate modulation codes into a nominal symbol and N candidate symbols, respectively. The nominal and N candidate symbols are sent to an error correction code ("ECC") decoder (not shown) for error correction. As compared to a conventional system in which only a symbol, which corresponds to the nominal symbol of the present invention, is provided for error correction, the N candidate symbols provided by signal processing system 10 consistent with the invention contain additional error information useful for error correction, advantageously resulting in an improvement in the error correction capability of an ECC decoder.

Figure 2:
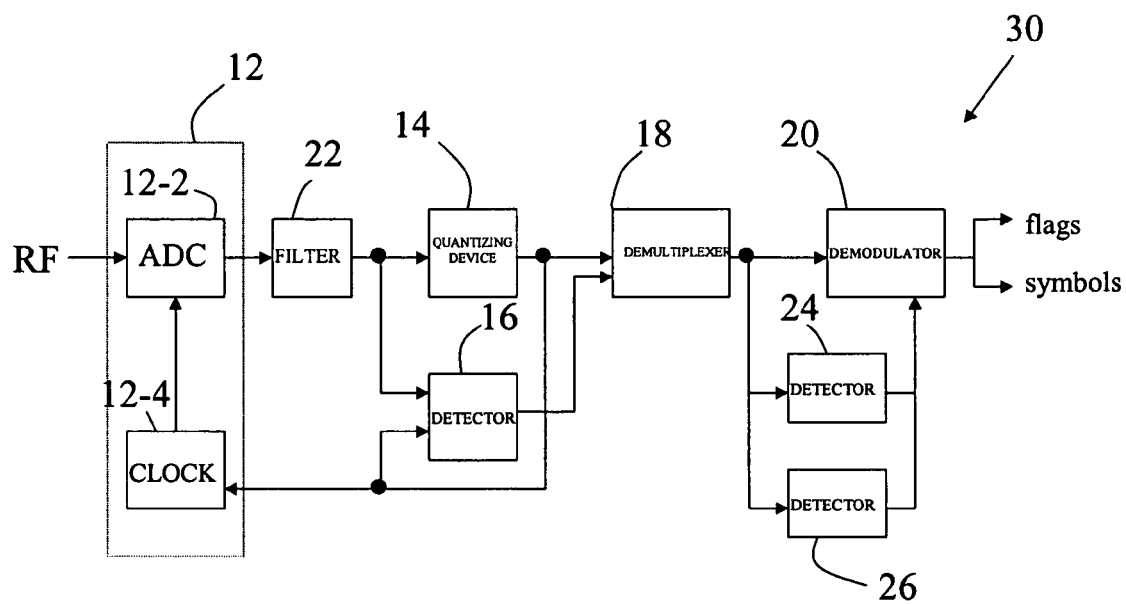
FIG. 2 is a schematic block diagram of a signal processing system in accordance with another embodiment of the present invention.

FIG. 2 is a schematic block diagram of a signal processing system 30 in accordance with another embodiment of the present invention. Referring to FIG. 2, signal processing system 30 has a similar structure to signal processing system 10 shown in FIG. 1 except further comprising a digital filter 22, a modulation code detector 24 and a run-length detector 26. Digital filter 22 is provided for noise rejection for the discrete reproduction signal, and may include a phase detection circuit for detecting phase shift amount in the discrete reproduction signal. With digital filter 22, signal processing system 30 is suitable for processing quadrature phase shift keying ("QPSK") or the like signals.

Modulation code detector 24 determines whether the nominal modulation codes and the candidate modulation codes are modulated correctly. In general, there are three types of methods for recording data in a recording/reproducing medium, an eight-to-fourteen modulation ("EFM") method, a new efficient modulation ("NEM") method; and an EFMplus method. The EFM method, which is generally used for CD, converts an 8-bit data into a 14-bit code. The NEM method modulates an 8-bit data to a 15-bit code. The EFMplus method converts an 8-bit data into a 16-bit code. Modulation code detector 24 compares data, for example, modulated in the EFMplus code, with a plurality of pieces of 2-byte data registered in a demodulation table. When an input data matches one registered in the demodulation table, modulation code detector 24 determines that the input data is modulated correctly. Demodulator 20, referring to the demodulation table, provides a 1-byte data corresponding to the input 2-byte data. On the other hand, when the input data does not match any of the pieces of data registered in the demodulation table, modulation code detector 24 determines that the input data is not modulated correctly. Demodulator 20, in response to the error data, provides an error flag to an ECC circuit indicating that the input data includes an error.

Run-length detector 26 determines whether the run-length of the nominal modulation codes and candidate modulation codes is correct. In recording data in a recording/reproducing medium, a mark edge recording method is generally used. According to the mark edge recording method, a binary bit "1" is assigned at an edge or boundary between a recording mark and a space, which is a portion between marks, and a binary bit "0" is assigned at each of other portions. To realize high recording density, a run-length limit ("RLL") code is used to limit the number of "0's" to be placed consecutively between "1" and "1". For example, in the case of the EFM method and the EFMplus method, the minimum value of the mark/space length is limited at 3T, where T is a channel clock cycle, and the maximum value of the mark/space length is limited at 11T. Run-length detector 26 detects whether the run-length of an input data meets the lower and upper limits. If the run-length of an input data exceeds the limit, demodulator 20 provides an error flag to the ECC circuit indicating that the input data includes an error.

Figure 3:
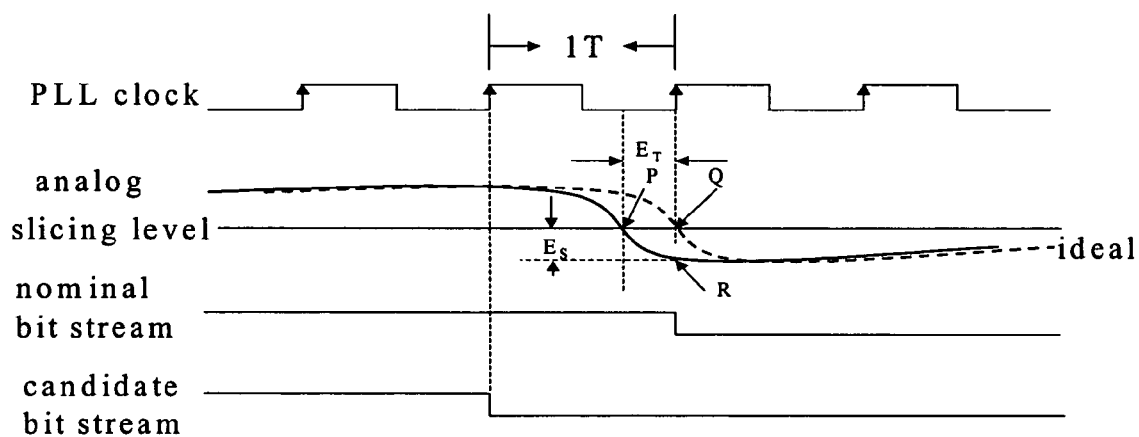
FIG. 3 is a diagram showing a method of obtaining error information in accordance with one embodiment of the present invention.

FIG. 3 is a diagram showing a method of obtaining error information in accordance with one embodiment of the present invention. Referring to FIG. 3, an analog or a digital reproduction signal is sampled by sampling device 12 to produce a clock having a channel clock cycle of T. In one aspect, sampling device 12 includes a fixed clock sampling circuit, which presumes zero phase error at locked PLL interpolation points. In another aspect as in the present example, sampling device 12 includes a PLL circuit, which presumes zero-cross points at PLL clock edges. Ideally, the waveform of the analog reproduction signal intersects a slicing level at a zero-cross point Q, which is in phase with a rising edge (shown by an arrow) of one of the clock. However, due to distortion, noise or interference, the waveform of the reproduction signal intersects the slicing level at a zero-cross point P, resulting in an offset component ET in a temporal axis between points P and Q. Quantizing device 14 detects the waveform characteristics and converts the sampled reproduction signal into a nominal bit stream. Detector 16 determines whether nominal bits in the bit stream include candidate bits.

As an example, quantizing device 14 detects that a transition occurs at a time point P associated with a rising clock edge at a time point Q, and determines that a nominal bit corresponding to the transition is a digital "1". If an offset $E_T$, for example, 0.3T, is smaller than a threshold predetermined by a user, for example, 0.5T, quantizing device 14 determines that the nominal bit does not have a candidate value. If, however, an offset $E_T$, for example, 0.6T, is greater than the threshold of 0.5T, quantizing device 14 determines that the nominal bit has a candidate value or candidate bit, that is, a digital "0". Demultiplexer 18 then detects time slots of the nominal bit stream and candidate bit streams. A time slot refers to the size of a modulation code, for example, 8 bits, 16 bits, etc. Demultiplexer 18 converts a section of the nominal bit stream including the nominal bit "1" into a nominal modulation code, for example, 11111111, which is most likely to describe a section of the waveform characteristics of the reproduction signal. Demultiplexer 18 also converts a section of a candidate bit stream including the candidate bit "0" corresponding to the nominal bit "1" into a candidate modulation code, for example, 1111110. Other possible candidate modulation codes include 01111111 and 01111110. In the case of an ideal waveform which is in phase with the clock, no candidate bits and therefore no candidate modulation codes are provided.

Moreover, if quantizing device 14 uses a PRML circuit, the PRML circuit determines the path length of a modulation code dynamically, for example, a 6-bit or 10-bit path length convergence. For instance, if nominal bits for a primary path are 001111, possible candidate bits may include 000111, 011111, etc. A PRML convergence may be determined if an offset between the evaluation index of each of unselected paths and that of the primary path exceeds a predetermined threshold.

In the demodulation procedure, in addition to the temporal error information $E_T$, a spatial error information $E_S$ can also be obtained for an analog reproduction signal. Referring again to FIG. 3, an offset component $E_S$ occurs in a spatial axis between points Q and R. A predetermined threshold associated with the spatial offset $E_S$ is used to determine whether a nominal bit has a candidate value. On the other hand, for a digital reproduction signal, a temporal error information or a spatial error information can also be obtained, as in the case of the analog reproduction signal.

Figure 4:
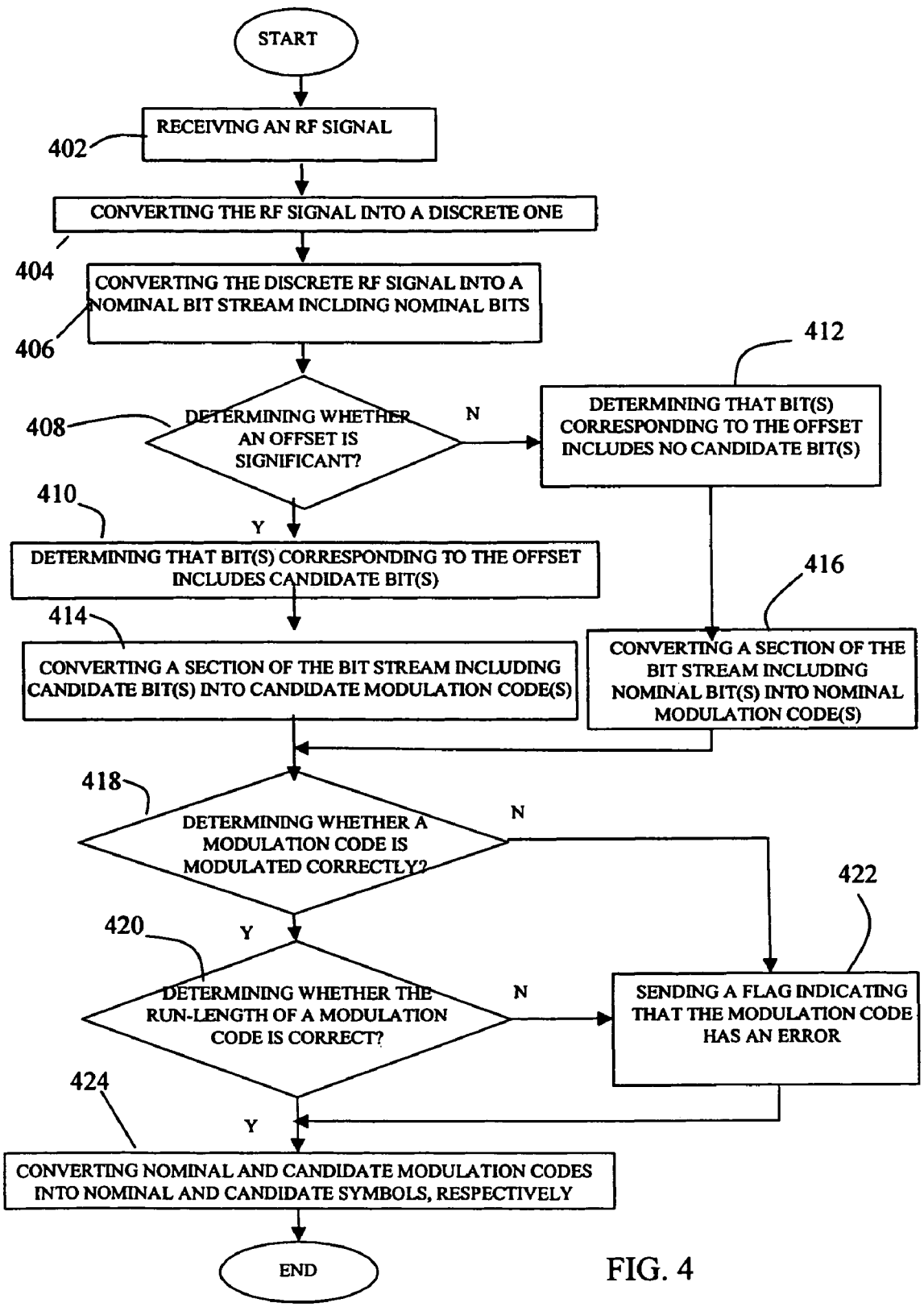
FIG. 4 is a flow diagram showing a method of signal processing in accordance with one embodiment of the present invention.

FIG. 4 is a flow diagram showing a method of signal processing in accordance with one embodiment of the present invention. Referring to FIG. 4, a reproduction signal such as a radio frequency ("RF") signal is received in step 402. In step 404, the RF signal is converted from a continuous one into a discrete one. Next, the discrete RF signal is converted into a bit stream in step 406. The bit stream is a nominal bit stream, in which all of the bits are nominal bits. In step 408, it is determined whether an offset is significant. The offset in one aspect may exist between a transition associated with a nominal bit and a clock edge corresponding to the transition. If the offset exceeds a predetermined threshold, the offset is determined significant. In another aspect, the offset represents the difference between an evaluation index of a primary path and that of one of unselected paths. If the offset falls below a predetermined threshold, the offset is determined significant.

If the offset is significant, in step 410, it is determined that a nominal bit associated with the offset includes a candidate value or candidate bit. If the offset is not significant, in step 412, it is determined that a nominal bit associated with the offset does not include any candidate value or candidate bit. A candidate bit stream is formed by replacing in the nominal bit stream a nominal bit with a candidate bit corresponding to the nominal bit, with other bits being equal. Next, in step 414, a section of the candidate bit stream is converted into a candidate modulation code. Likewise, in step 416, a section of the nominal bit stream is converted into a nominal modulation code.

Next, in step 418, the nominal modulation codes and candidate modulation codes are detected to determined whether they are correctly modulated. If a nominal or candidate modulation code is not modulated correctly, in step 422, an error flag is sent to an ECC circuit indicating that the nominal or candidate modulation code includes an error. In step 420, the run-length of a nominal or candidate modulation code is detected to determine whether the run-length is correct. If the run-length is not correct, in step 422, an error flag is sent to the ECC circuit indicating that the nominal or candidate modulation code includes an error. The step 418 for modulation code detection and the step 420 for run-length detection are optional and interchangeable. Next, in step 424, the nominal modulation codes are converted into nominal symbols, and the candidate modulation codes are converted into candidate symbols. Subsequently, the nominal and candidate symbols are sent to the ECC circuit.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A signal processing system, comprising:
    a sampling device for converting a continuous signal into a discrete signal;
    a quantizing device for converting the discrete signal into a first bit stream, each bit in the bit stream having a first value;
    a detector for determining whether at least one bit in the first bit stream includes a second value different from the first value of the at least one bit; and
    a demultiplexer for converting a section of the first bit stream into a first modulation code, and converting a section of a second bit stream into a second modulation code, the second bit stream being formed by replacing the first value of the at least one bit in the first bit stream with the second value.

2. The system of claim 1, further comprising a digital filter between the sampling device and the quantizing device.

3. The system of claim 1, wherein the quantizing device includes one of a digitizer circuit or a partial response maximum likelihood ("PRML") circuit.

4. The system of claim 3, wherein the detector determines whether an offset between a transition associated with the at least one bit and a corresponding clock edge provided by the sampling device is significant.

5. The system of claim 3, wherein the detector determines whether an offset between an evaluation index of a selected path and an evaluation index of one of unselected paths is significant.

6. The system of claim 4, wherein the offset is determined significant if the offset exceeds a threshold.

7. The system of claim 5, wherein the offset is determined significant if the offset falls below a threshold.

8. The system of claim 1, further comprising a demodulator for converting the first modulation code into a first symbol, and converting the second modulation code into a second symbol.

9. The system of claim 1, further comprising a detector for detecting whether the first or second modulation code is modulated correctly.

10. The system of claim 1, further comprising a detector for detecting whether the run- length of the first or second modulation code is correct.

11. The system of claim 9, further comprising a demodulator for providing a flag signal if the first or second modulation code is not correctly modulated.

12. The system of claim 10, further comprising a demodulator for providing a flag signal if the run-length of the first or second modulation code is not correct.

13. A signal processing system, comprising:
a sampling device for converting a continuous signal into a discrete signal transmitting in a waveform;
a digitizer circuit for converting the discrete signal into a first bit stream, each bit in the first bit stream having a first value, and detecting whether a transition occurs at an interception of the waveform of the discrete signal and a slicing level;
a detector for determining whether an offset between the transition and a corresponding clock edge provided by the sampling device is significant, and determining that a bit in the first bit stream associated with the transition includes a second value different from the first value of the bit if the offset is significant; and
a demultiplexer for converting a section of the first bit stream into a first modulation code, and converting a section of a second bit stream into a second modulation code, the second bit stream being formed by replacing the first value of the bit in the first bit stream with the second value.

14. The system of claim 13, further comprising a phase detection circuit between the sampling device and the digitizer circuit.

15. The system of claim 13, wherein the offset is determined significant if the offset exceeds a predetermined threshold.

16. The system of claim 13, wherein the offset occurs in one of a temporal direction or a spatial direction.

17. The system of claim 13, further comprising a detector for detecting whether the first modulation code or second modulation code matches a modulation code registered in a demodulation table.

18. The system of claim 13, further comprising a detector for detecting whether the first modulation code or second modulation code meets a limit on run-length.

19. The system of claim 17, further comprising a demodulator for providing a flag signal if the first or second modulation code does not match the modulation code registered in the demodulation table.

20. The system of claim 18, further comprising a demodulator for providing a flag signal if the first or second modulation code does not meet the limit on run-length.

21. A signal processing system, comprising:
a sampling device for converting a continuous signal into a discrete signal;
a partial response maximum likelihood ("PRML") circuit for selecting a path of the most likelihood among a plurality of maximum likelihood paths each having an evaluation index, and converting the selected path into a first bit stream, each bit of the first bit stream having a first value;
a detector for determining whether an offset between the evaluation index of the selected path and the evaluation index of one of the unselected paths is significant, and determining that at least one bit in the first bit stream includes a second value different from the first value of the at least one bit if the offset is significant; and
a demultiplexer for converting a section of the first bit stream into a first modulation code, and converting a section of a second bit stream into a second modulation code, the second bit stream being formed by replacing the first value of the at least one bit in the first bit stream with the second value.

22. The system of claim 21, further comprising a phase detection circuit between the sampling device and the PRML circuit.

23. The system of claim 21, further comprising a detector for detecting whether the first or second modulation code is modulated correctly.

24. The system of claim 21, further comprising a detector for detecting whether the run- length of the first or second modulation code is correct.

25. The system of claim 23, further comprising a demodulator for providing a flag signal if the first or second modulation code is not correctly modulated.

26. The system of claim 24, further comprising a demodulator for providing a flag signal if the run-length of the first or second modulation code is not correct.

27. The system of claim 21, wherein the offset is determined significant if the offset falls below a-predetermined threshold.

28. A method of signal processing, comprising:
converting a continuous signal into a discrete signal;
converting the discrete signal into a first bit stream, each bit in the first bit stream having a first value;
determining whether at least one bit in the first bit stream includes a second value different from the first value of the at least one bit;
forming a second bit stream by replacing the first value of the at least one bit in the first bit stream with the second value;
converting a section of the first bit stream into a first modulation code; and
converting a section of the second bit stream into a second modulation code.

29. The method of claim 28, further comprising filtering the discrete signal.

30. The method of claim 28, further comprising determining whether an offset between a transition associated with the at least one bit and a corresponding clock edge provided by the sampling device is significant.

31. The method of claim 28, further comprising determining whether an offset between an evaluation index of a selected path and an evaluation index of one of unselected paths is significant.

32. The method of claim 30, further comprising determining that the offset is significant if the offset exceeds a threshold.

33. The method of claim 31, further comprising determining that the offset is significant if the offset falls below a threshold.

34. The method of claim 28, further comprising detecting whether the first or second modulation code is modulated correctly.

35. The method of claim 28, further comprising detecting whether the run-length of the first or second modulation code is correct.

36. The method of claim 28, further comprising providing a flag signal indicating that the first or second modulation code includes an error.

37. A method of signal processing, comprising:
converting a continuous signal into a discrete signal transmitting in a waveform;
converting the discrete signal into a first bit stream, each bit in the first bit stream having a first value;
detecting whether a transition occurs at an interception of the waveform of the discrete signal and a slicing level;
determining whether an offset between the transition and a corresponding clock edge provided by the sampling device is significant;
determining that a bit in the first bit stream associated with the transition includes a second value different from the first value of the bit if the offset is significant;
forming a second bit stream by replacing the first value of the bit in the first bit stream with the second value;
converting a section of the first bit stream into a first modulation code; and
converting a section of the second bit stream into a second modulation code.

38. The method of claim 37, further comprising detecting whether the first modulation code or second modulation code matches a modulation code registered in a demodulation table.

39. The method of claim 37, further comprising detecting whether the first modulation code or second modulation code meets a limit on run-length.

40. The method of claim 38, further comprising providing a flag signal indicating that the first or second modulation code includes an error.

41. The method of claim 39, further comprising providing a flag signal indicating that the first or second modulation code includes an error.

42. A method of signal processing, comprising:
converting a continuous signal into a discrete signal;
selecting a path of the most likelihood among a plurality of maximum likelihood paths each having an evaluation index;
converting the selected path into a first bit stream, each bit of the first bit stream having a first value;
determining whether an offset between the evaluation index of the selected path and the evaluation index of one of the unselected paths is significant;
determining that at least one bit in the first bit stream includes a second value different from the first value of the at least one bit if the offset is significant;
forming a second bit stream by replacing the first value of the at least one bit in the first bit stream with the second value;
converting a section of the first bit stream into a first modulation code; and
converting a section of the second bit stream into a second modulation code.

43. The method of claim 42, further comprising detecting whether the first modulation code or second modulation code matches a modulation code registered in a demodulation table.

44. The method of claim 42, further comprising detecting whether the first modulation code or second modulation code meets a limit on run-length.

45. The method of claim 42, further comprising providing a flag signal indicating that the first or second modulation code includes an error.

* * * * *